(12) United States Patent
Ginanneschi

(10) Patent No.: US 7,772,503 B2
(45) Date of Patent: Aug. 10, 2010

(54) MOVABLE ELECTROMAGNETIC SHIELDING DEVICE FOR NUCLEAR MAGNETIC RESONANCE APPARATI AND METHOD FOR MAKING THE SAME

(75) Inventor: Aldo Ginanneschi, Milan (IT)

(73) Assignee: Esaote S.p.A., Milan (IT)

( * ) Notice: Subject to any disclaimer, the term of this patent is extended or adjusted under 35 U.S.C. 154(b) by 211 days.

(21) Appl. No.: 11/849,320

(22) Filed: Sep. 3, 2007

(65) Prior Publication Data
US 2008/0060843 A1 Mar. 13, 2008

(30) Foreign Application Priority Data
Sep. 1, 2006 (EP) .................. 06120018

(51) Int. Cl.
*H05K 9/00* (2006.01)
(52) U.S. Cl. ................ 174/378; 174/383; 600/421; 335/301; 324/318; 250/516.1
(58) Field of Classification Search .......... 174/377, 174/378, 383; 600/421; 361/816, 818; 335/301; 324/318; 250/516.1
See application file for complete search history.

(56) References Cited

U.S. PATENT DOCUMENTS

| | | | |
|---|---|---|---|
| 4,490,675 A | 12/1984 | Knuettel et al. | |
| 5,028,872 A | 7/1991 | Nakabayashi | |
| 5,099,135 A * | 3/1992 | Gemmill | 250/516.1 |
| 5,543,710 A * | 8/1996 | Jones | 324/318 |
| 5,594,200 A * | 1/1997 | Ramsey | 174/382 |
| 5,986,531 A * | 11/1999 | Carrozzi | 335/301 |
| 6,163,240 A | 12/2000 | Zuk et al. | |
| 6,968,993 B1 * | 11/2005 | Russell | 232/17 |

(Continued)

FOREIGN PATENT DOCUMENTS

EP 0 067 933 A1 12/1982

(Continued)

OTHER PUBLICATIONS

European Search Report of Application No. 06120018.4, 2009; dated Apr. 5, 2007.

*Primary Examiner*—Hung V Ngo
(74) *Attorney, Agent, or Firm*—Buchanan Ingersoll & Rooney PC

(57) ABSTRACT

An electromagnetic shielding device for an MRI apparatus having a fastener for fastening the shielding device to a shielding element in the apparatus so as to surround said opening of a cavity and which shielding device is electrically connected to ground, wherein the fastener electrically connects the shielding device to the shielding element at the cavity opening; wherein the shielding device is flexible and is cylindrical and/or in a truncated cone shape, and has at least a passage opening for the body part; the shielding device is adapted to be fastened or compressed at said opening to the body part with a predetermined force in such a way as to close said opening and generate a low-impedance electrical contact between the body part and said shielding device to prevent or reduce the infiltration of electromagnetic noise from outside to inside said detection cavity; the shielding device is made of a first inner conductive material layer and an outer insulating fabric layer; and further includes at least one additional electrically conductive material layer overlapping and electrically connected to the first inner electrically conductive material layer.

25 Claims, 6 Drawing Sheets

U.S. PATENT DOCUMENTS

| | | | |
|---|---|---|---|
| 7,006,860 B2 * | 2/2006 | Menon | 600/422 |
| 7,394,256 B2 * | 7/2008 | Schubert et al. | 324/321 |
| 2004/0004196 A1 * | 1/2004 | DeMeo et al. | 250/516.1 |
| 2005/0090734 A1 * | 4/2005 | Contrada et al. | 600/420 |

FOREIGN PATENT DOCUMENTS

| | | |
|---|---|---|
| EP | 0 151 726 A2 | 8/1985 |
| EP | 0 825 450 B1 | 2/1998 |
| JP | 62-207448 | 9/1987 |
| JP | 62-299248 | 12/1987 |
| JP | 8-252233 A | 10/1996 |
| WO | WO 97/35206 | 9/1997 |

* cited by examiner

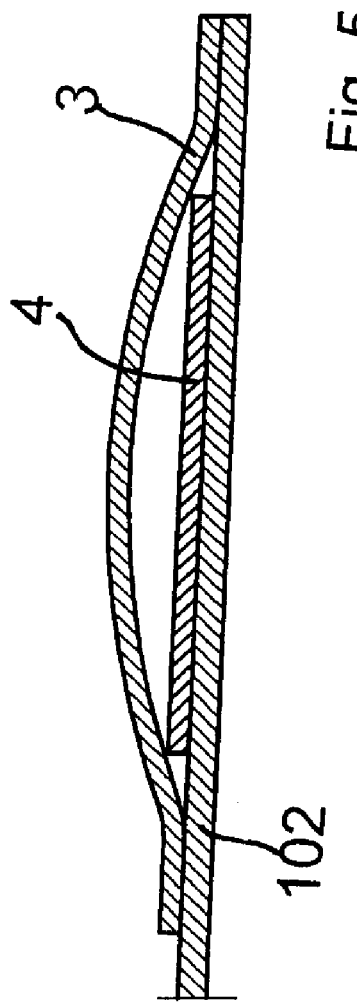
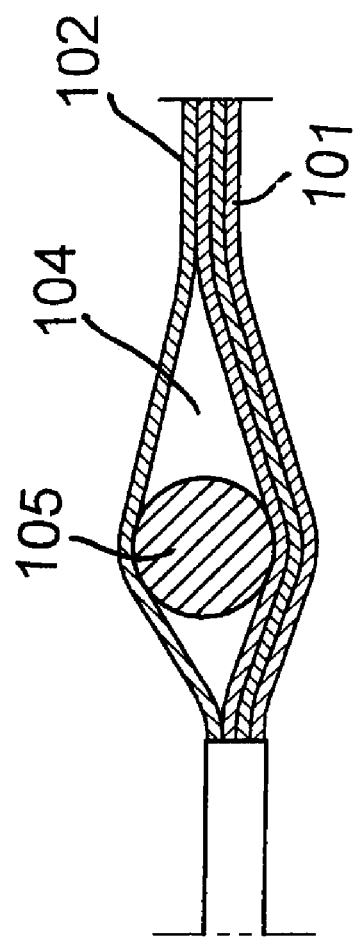
Fig. 5
Fig. 6

MOVABLE ELECTROMAGNETIC SHIELDING DEVICE FOR NUCLEAR MAGNETIC RESONANCE APPARATI AND METHOD FOR MAKING THE SAME

CROSS-REFERENCE TO RELATED APPLICATIONS

The present application claims priority of European Patent Application No. 06120018.4, filed on Sep. 1, 2006, the entire contents of which are incorporated herein by reference.

FIELD OF THE INVENTION

The invention relates to a removable electromagnetic shielding device for MRI apparati having a magnetic structure defining a cavity with at least an opening for introducing the body or the part thereof under examination.

BACKGROUND

In European patent 825 450 a shielding device is described, i.e., an electromagnetic shielding device for nuclear magnetic resonance apparati, particularly for apparati intended for imaging specific body parts. The device has a detection cavity with one opening for introducing the body part under examination, an electromagnetic shielding structure enclosing transmitting and receiving coils, and removable shielding elements electrically connectable to said shielding structure, which removable elements have the function of reducing the span of the opening of the detection cavity and so to prevent or reduce the infiltration of electromagnetic noise from the outside to the inside of said cavity for acquiring MRI signals, particularly in apparati wherein the cavity is a tubular one i.e. it has at least an opening and/or two opposite coaxial openings, and wherein the rigid shielding element is a tubular element extending from one to the other one of the opposite openings.

These removable elements are composed of sleeves extending the tubular shielding element and can be compressed with a predetermined force against body parts under examination at least at one passage opening for the body part. In order to connect the patient body to the shield, and thus to the ground, and to neutralize possible electromagnetic noise said sleeves are composed of a conductive material layer on the inner side and at the opening contacting the body they have a coulisse wherein a string is housed for fastening the sleeve against the body.

While this device satisfactorily serves its function, it has some drawbacks.

MRI apparati used for imaging parts of the body, so called dedicated apparati, such as parts of arms or legs, are structures having small size wherein the detection cavity is defined in its shape substantially by the shape of the coil of the magnet generating the static field. In apparati of this type, wherein the generated magnetic field has a middle low intensity, it is important to reduce at a minimum infiltrations of electromagnetic noise inside the cavity itself.

Moreover in nuclear magnetic resonance image detection apparati for predetermined body parts, a considerable part of the body remains outside the detection cavity and acts as an antenna, through which electrical variations penetrate up to the detection area of the cavity, and particularly up to the body part under examination, and so up to the receiving coils.

The device object of the European patent 825 450 partly solves these problems since the shielding sleeve disclosed in the text is composed of a single conductive material fabric layer anchored to an outer fabric insulating layer made of synthetic fiber and to ensure contact with the body, the sleeve has a simple coulisse in which a fastening string is made to slide ensuring a perfectly closed form of the truncated cone-shaped sleeve but it does not completely solves the problem of the "antenna effect" performed by the part of the body that remains outside the apparatus since the electrical conductivity both of body-sleeve and sleeve-shielding connections of the apparatus and of the sleeve itself is relatively low.

OBJECTS AND SUMMARY

An aim of the present invention is to provide an electromagnetic shielding device for nuclear magnetic resonance apparati, particularly for apparati being meant to detect images of predetermined body parts, which, thanks to simple and cheap expedients, effectively reduce or further eliminate the penetration of electromagnetic pulses inside the cavity detecting and acquiring MRI images through the patient body placed partly inside and partly outside said scanner.

An embodiment of the present invention can be easily used by people not skilled in the biomedical field and it is a shielding structure that is easy and comfortable to be used during operations for assembling and disassembling parts of the MRI apparatus that have to be connected to the detection cavity.

Moreover, since the imaging can require the patient to remain in close contact with the apparatus, the embodiment of the present invention at the same time is comfortable, non-traumatic and visually reassuring for the patient.

One embodiment of the present invention is a removable electromagnetic shielding device for MRI apparati having a magnetic structure defining a cavity with at least an opening for introducing the body or the part thereof under examination, which cavity is surrounded by a shielding element having an opening coinciding with said at least one opening of the cavity and means fastening the removable device which surround said cavity opening and which shielding device is electrically connected to the ground, which removable device:

- is provided at opening/openings of the detection cavity and at least electrically connected thereto;
- is flexible and it is cylindrical and/or has a truncated cone shape and it has at least a passage opening for the body or parts thereof;
- may be fastened or compressed at said opening with a predetermined force against said body parts in such a way as to close said opening/openings and generate a low-impedance electrical contact between the body and said device to prevent or reduce the infiltration of electromagnetic noise from the outside to the inside of said detection cavity,
- is made of an inner conductive material layer and an outer insulating fabric layer.

Said device further comprises at least one, preferably two, additional inner electrically conductive material layers overlapped to the first inner electrically conductive material layer.

Advantageously the removable device may be compressed along a band contacting the body having a predetermined length. Particularly in order to improve the electrical contact between the body and the device, at least at a passage opening for a body part there is provided an annular band contacting the inner electrically conducting layer of the sleeve against the body part under examination, which band extends along the edge of the opening there being provided engaging means thereof along said band and said band being provided of a predetermined width.

The band or belt which is fastenable around the body has the advantage of offering a larger surface for direct contact between the skin and the electrically conducting fabric of the device, helping to increase the conducibility between the skin and the sleeve. Moreover the band, having a length greater than the diameter of the opening of the bellows sleeve on the side contacting the body, allows the sleeve to be adapted to the morphology of patient limbs and to different sizes. Particularly, the removable shielding device, in addition to the fact of having such an axial length to keep a certain distance between the opening of the shielding device and the area detecting images, has flexible and deformable walls, that can be partly pleated one upon the other like a bellows and having various conductive fabric layers, for example a copper wire mesh or the like.

Alternatively, it is also possible to use a metallized fabric, or sheets made of conductive materials, preferably having characteristics of deformability and flexibility, such as, for example, aluminium sheets, or the like.

To ensure contact with the body, the shielding device particularly of a truncated cone shape but not limited to the latter has the band, allowing the removable electrical contact between the innermost mesh layer made of electrically conductive material, sliding inside a crown of loops placed on the outermost side of the sleeve and it can be attached thereto by means of velcro portions sewn on the band itself and on outer faces of loops. That ensures a perfectly closed form of the truncated cone-shaped sleeve and a progressive fastening with a securing action in the fastening condition very strong since the belt is locked at various loops depending on then size of the body part against which the sleeve is fastened.

On the side being connected to the stationary shielding element, there are provided means for mechanical/electrical connection made of removable snap coupling elements, such as snap fasteners, made of conductive material, or which are electrically connected, on the sleeve, to the conductive layer/layers of mesh, whereas in the detection area, they form a crown extending along the edge of the opening/s of the detection area, each snap fastener, or other means, being electrically connected to the corresponding end of the stationary part of the shield.

According to a further characteristic as an alternative or in combination with, on the side connected to the stationary shield, the sleeve may have a coulisse with a string or elastic fastening element held therein, and in this case, the stationary shield ends with an annular flange, having an L-cross section, which projects out of the apparatus case, and surrounds the opening/s of the detection cavity and with which the elastic element engages.

The combination of the different solutions proposed herein allows to provide an effective shielding even with detection cavities of apparati having middle low magnetic field. Particularly the use of various electrically conductive layers held together by perimetral and transverse seams allows to have a continuous shielding action between the stationary shielding element and the removable one.

In order to improve the electrical contact between the body and the element for closing the shield on the open side/s of the detection cavity, i.e. generally between the skin of the patient and said element, it is possible to use electrolytic substances, to be applied to the skin in the contact area.

Another embodiment of the present invention relates also to a method for manufacturing the removable electromagnetic shielding device providing the following steps, particularly for manufacturing a sleeve-like device, with bellows walls, for MRI apparati with a tubular detection cavity:

cutting fabric layers composing the sleeve made such to produce a multilayer fabric piece having a predetermined development and intended to form the shell wall of the sleeve;

printing seam lines on the outer side of the wall of the piece by serigraphy;

printing signs for properly positioning device elements, such as snap fasteners or ventilation holes, by serigraphy;

sewing fabric layers along the junction line of the shell of the sleeve, i.e., along piece edges oriented parallel with respect to the axial direction of the sleeve in its finished condition;

sewing the insulating layer and the innermost electrically conductive layer by perimetral and transverse seams;

sewing on said layers further electrically conductive layers, particularly the second and the third electrically conductive layer by perimetral seams;

delimiting the tubular channel or coulisse wherein the elastic element is engaged by one or more seams along the longitudinal edge of the fabric;

bordering the piece by sewing a tape along the longitudinal edge along which the coulisse is provided and along the longitudinal edge of the sleeve opening that is fastened against the part of the patient body under examination;

sewing loops engaging the fastening belt provided at the perimetral edge for fastening against the part of the patient body under examination;

housing the fastening belt in loops.

Substantially according to this manufacturing method a device with flexible walls having a bellows shape for introducing body parts of any size inside the detection cavity is obtained.

The manufacturing method may further comprise the following steps:

perforating the shell of the sleeve for making ventilation apertures, positioning loops at perforations by a fastening action, positioning the electrically conductive fabric band at the edge along which snap fasteners are provided, perforating the shell of the sleeve for positioning snap fasteners, positioning components of snap fasteners by fastening action, sewing mechanical attaching band like Velcro or the like on loops and on the outer and inner face of the fastening belt.

The sleeve object of the present invention is soft and very extremely adaptable to morphology of body parts of the patient, particularly to morphology of limbs and to various sizes and above all it ensures a high shielding against electromagnetic radiations by means of a better electric connection interface between the patient body and the sleeve.

BRIEF DESCRIPTION OF THE DRAWINGS

These and other characteristics and advantages of the present invention will be clearer from the following description of some embodiments shown in annexed drawings wherein:

FIG. 5 is cross sectional view of the fastening belt inside a loop, FIG. 6 is a cross sectional view of the coulisse inside which a fastening element slides.

DETAILED DESCRIPTION OF THE PREFERRED EMBODIMENTS

Figure 1:
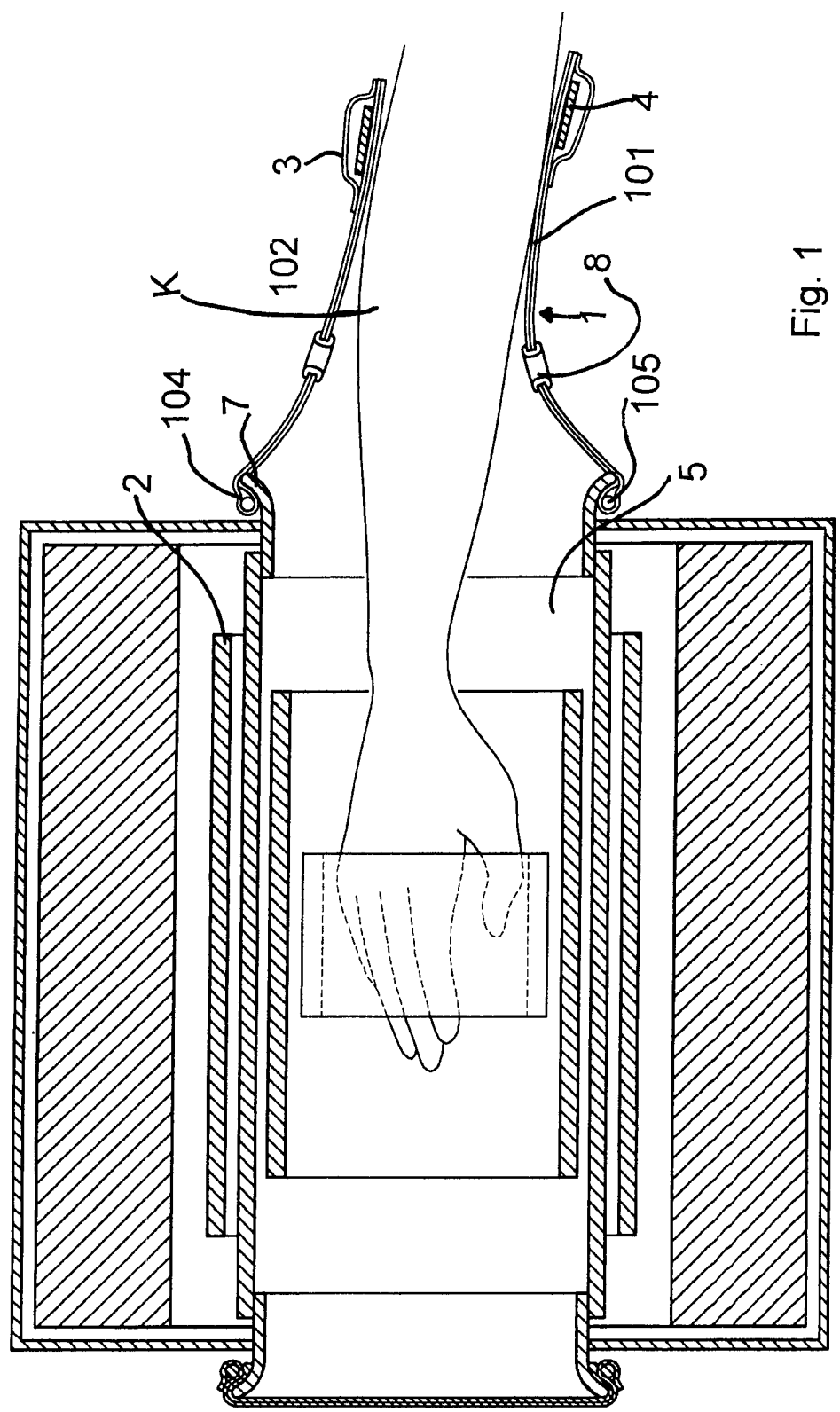
FIG. 1 is an axial sectional view of a nuclear magnetic resonance image detection apparatus of the type meant for the analysis of some body parts with a removable shielding device mounted thereto.
Figure 2:
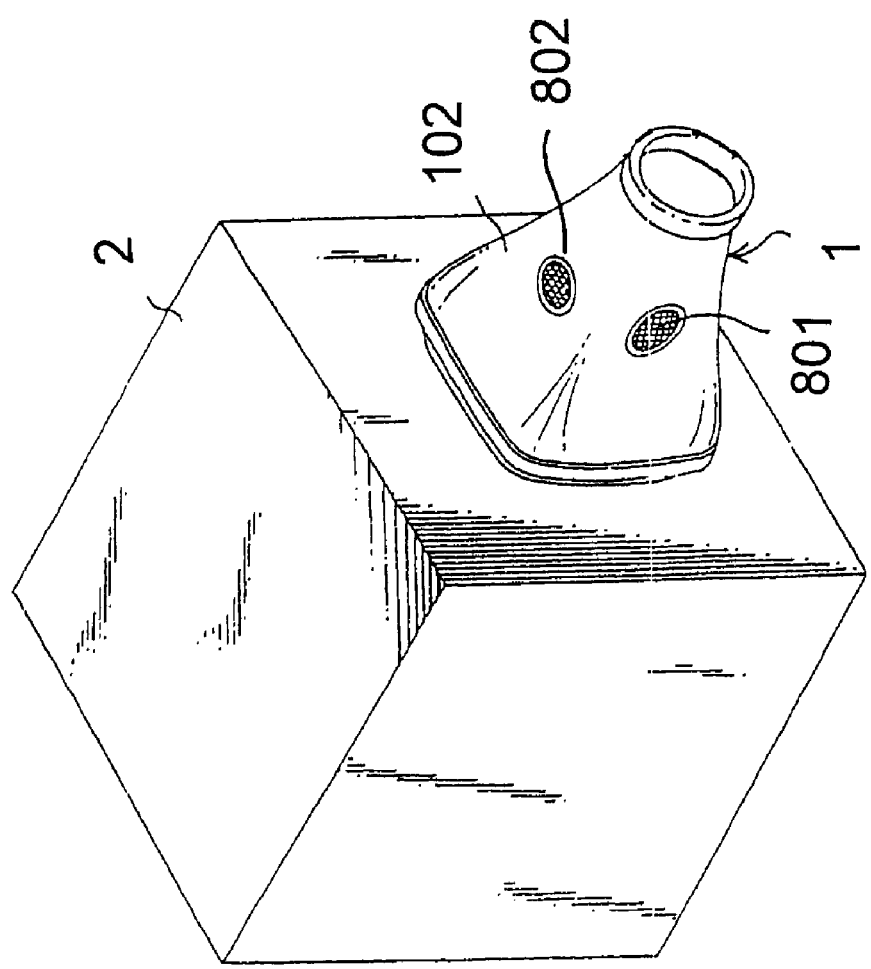
FIG. 2 is a schematic perspective view of a device according to FIG. 1, with the removable shielding device mounted thereto.
Figure 3:
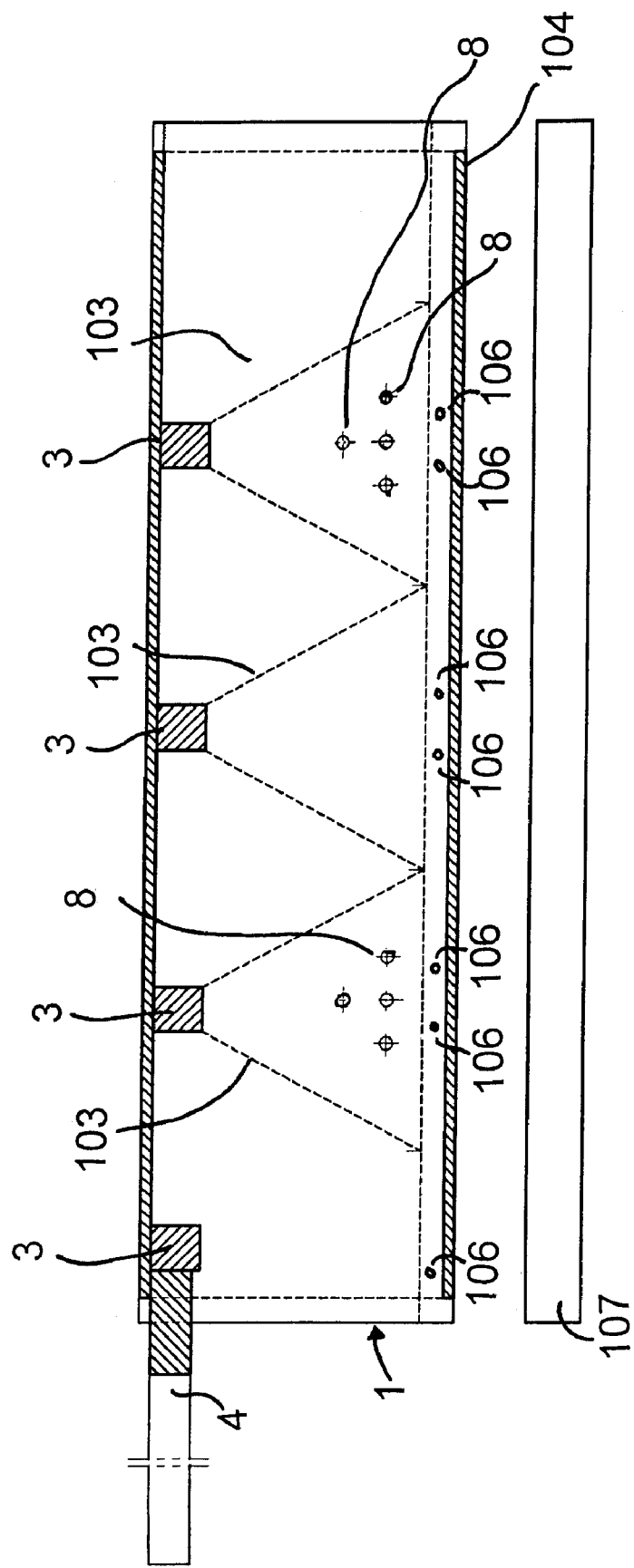
FIG. 3 is a top view of the plane development of the removable device with the shell wall opened.
Figure 4:
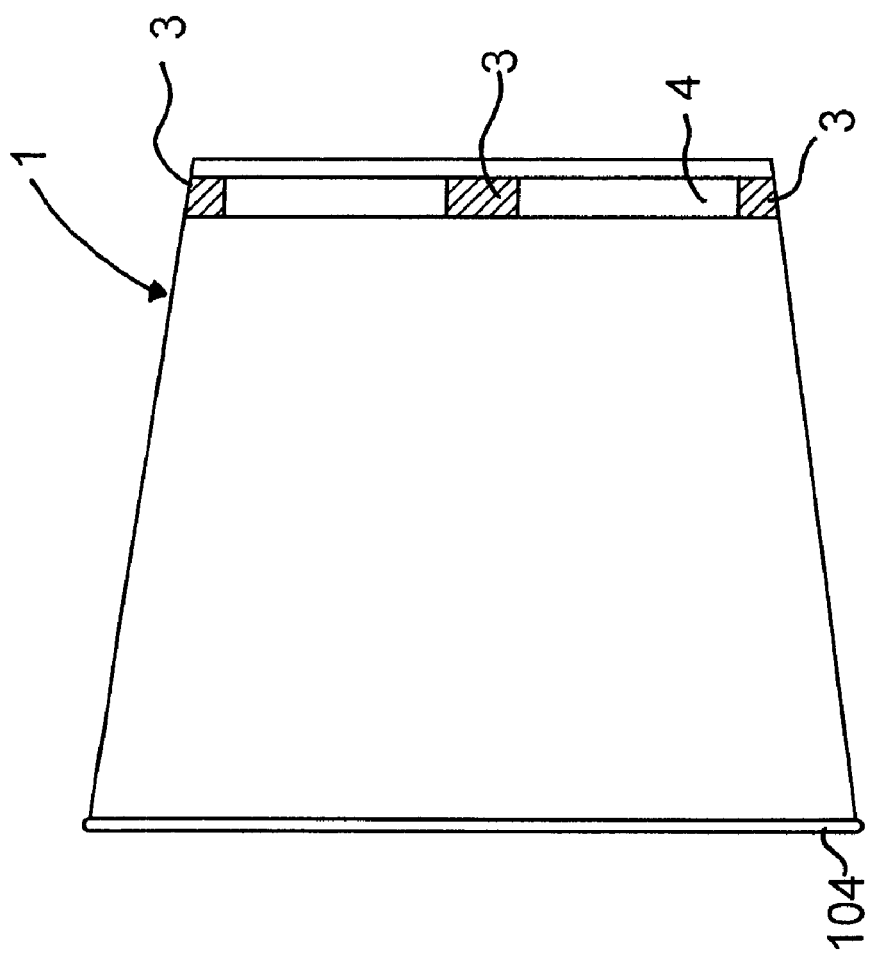
FIG. 4 is a side view of the removable device according to a configuration like to the one of FIG. 2.
Figure 7:
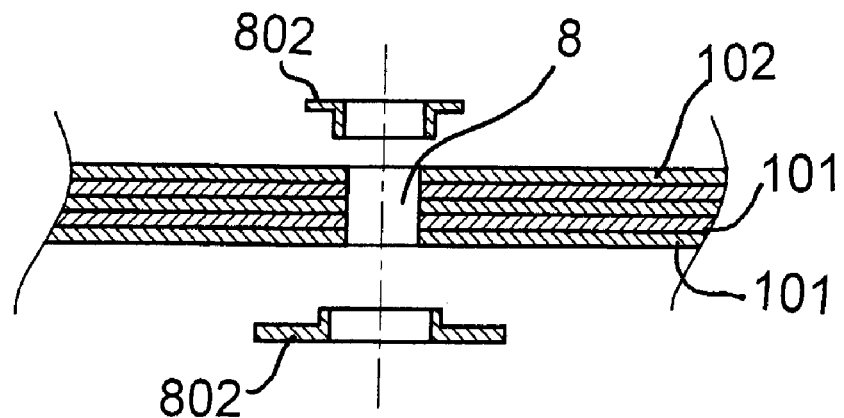
FIG. 7 is a cross sectional view of an eyelet delimiting ventilation apertures in its positioning condition.

Referring to FIG. 1, a nuclear magnetic resonance image detection apparatus comprises a magnet for generating a static field, a gradient coil, one or more coils for transmitting exciting pulses, and one or more receiving coils. The magnet for generating the static field defines, together with the other coils, a detection cavity 5, in which the receiving coil/s are held and into which the body K or the part thereof to be examined is inserted. In an intermediate position, between the transmitting coil/s and the gradient coil, there is provided a shielding element 2 entirely surrounding the detection cavity 5 and it has an opening coinciding with said at least one opening of the cavity 5. Said shielding element 2, connected to ground, is provided with means for mechanical removable attachment and electrical connection between the shielding element 2 and a removable shielding device 1, at the at least one opening of the cavity 5.

Said attachment means include a flange 7, having an L-shaped section, with respect to an axial plane, connected to the opening of the shielding element 2 coinciding with the at least one opening of the detection cavity 5. To the flange 7 there can be attached the removable shielding device 1 composed of a tubular sleeve, particularly a truncated cone-shaped or cylindrical one, or the like, that can be fitted to the morphology of patient limbs and to various sizes due to the fact that it is composed of a flexible material such as fabric or the like and/or due to a bellows structure, thus an opening having sizes that can be changed is possible for inserting body parts K with different sizes projecting out of the detection cavity 5.

The shielding device 1 acts for reducing the span of the open side of the cavity 5 to which it is associated, and, due to the fact of having a predetermined length, it keeps the position of the opening wherein the part to be examined is inserted far from the area of the cavity 5 in which the echoes of nuclear spins are detected.

The soft and truncated cone-shaped movable device 1 is provided with fastening means around the corresponding body part K which projects out of the detection cavity 5 such that it is possible for said device 1 to be fastened or compressed against said body parts K with a predetermined force, in order to close said opening/openings and to generate a low impedance electrical contact between the body K and said device 1 preventing or reducing the infiltration of electromagnetic noise from the outside to the inside of the detection cavity 5.

The removable cylindrical device 1, having bellows walls, internally has an electrically conductive material inner layer 101, at least partially made of metal or metallized wires, particularly copper plated and, externally, it is provided with an insulating fabric layer 102, for example made of synthetic fibers. Particularly, the device 1 comprises at least one, preferably two, additional inner electrically conductive material layers 101 that are overlapped with the first electrically conductive material inner layer 101. The fabric layers are connected one to the other both mechanically and/or electrically in any manner and according to any patterns arranging the mutual contact areas, for example by partial or total gluing and/or seams along one or more lines.

In a preferred embodiment the two or more electrically conductive material layers are in electrical and/or mechanical contact along mechanical connection lines such as seams or the like 103 extending at least along perimetral edges. Particularly said mechanical connection lines such as seams or the like 103 are provided also at intermediate areas or they pass through intermediate areas of said sleeve 1, thus being perimetral and transverse seams 103 uniformly arranged on the surface of the sleeve 1.

At the head end on the side attaching to the shielding element 2, opposite to the end associated to the body K, the two types of fabric 101, 102 are sewed and/or folded on themselves in order to make a coulisse or tubular channel 104 for passing an element, an elastic ring of the O-ring type, or a string 105 for fastening the L-shaped flange 7 connected to the opening of the shielding element 2 coinciding with the at least one opening of the detection cavity 5. The coulisse 104 is made by sewing fabric flaps composing parts of the device 1 and it is made such that the elastic ring 105 sliding inside it remains on the outer side of the removable sleeve-like device 1 and the electrically conductive fabric 101 remains on the inside, thus generating the electrical contact between the sleeve 1 and the flange 7.

According to a further characteristic, the electrical and mechanical contact between the removable sleeve device 1 and the flange 7 forms an extension of the stationary part of the shield 2 and is obtained by a crown of first and/or second parts of snap fasteners 106 made of electrically conductive material, particularly chromium-plated brass, and they are in a condition of electrical contact with at least an electrically conductive material layer 101 while the shielding element 2 at its opening is provided with a crown of respective first and second parts of snap fasteners 106 made of electrically conductive material, particularly chromium-plated brass, and electrically connected to said shielding element 2.

Figure 8:
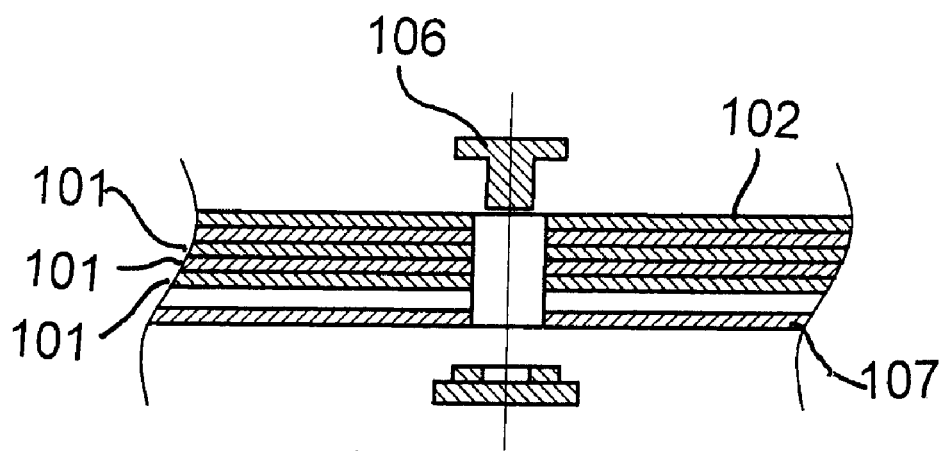
FIG. 8 is cross sectional view of a snap fastener in its positioning condition.

Advantageously there is provided an electrically conductive fabric band 107, particularly made of a fabric of copper or copper plated wires, extending along the inner strip of the sleeve wall, by overlapping it, at which perforations of snap fasteners 106 are provided, in order to create a thickness at said perforations. Said fabric band 107 may be advantageously provided in an intermediate position between the insulating fabric layer 102 and the innermost conductive material layer 101 such that it cannot be seen from the outside. Particularly FIG. 8 shows the positioning of snap fasteners, particularly made of chromium-plated brass at holes made on the surface of the device 1 and on respective perforations made on the fabric band 107 having a stiffening function.

The device 1 further has also ventilation apertures 8, allowing air to circulate inside the sleeve 1, thus preventing excessive perspiration of the patient.

Advantageously said ventilation apertures 8 can be in the condition of electrical contact with at least one of the electrically conductive material layers 101, particularly apertures are delimited by eyelets 802, which are made of an electrically conductive material at least on the side of the electrically conductive fabric 101.

As shown in figures, the span of said ventilation apertures 8 is closed by a gauze or mesh 801 made also of electrically conductive material.

FIG. 8 shows the positioning of eyelets 802, which can be made of plastic material, at holes made on the wall of the sleeve 1.

In order to improve the electrical contact with the skin, the end of the sleeve 1 associated with the body K has a passage opening surrounded by a fastening belt 4 having a predetermined width and intended to hold the innermost conductive material layer 101 of the sleeve device 1 against the patient body K along a band of predetermined width such to obtain a better conducibility between the skin and the device 1, independent from the physiological conditions of the skin of the patient, thanks to a large contacting surface between the skin and the electrically conductive layer of the sleeve.

The belt 4 is kept in place by a crown of spaced apart loops 3 provided at the opening of the device 1 associated with the body K.

In one embodiment, on the outer face of the loops 3 is arranged one of the two layers or components of a mechanical attaching tape of the type called Velcro or the like, and the fastening belt 4 is arranged on the the outer face of said loops 3. The other layer or component of the two layers of the mechanical attaching tape like Velcro or the like are arranged on the inner face of the belt 4. The layer of the mechanical attaching tape extends for at least a part of the length and of the width of the fastening belt 4 and/or in a continuous way for the length and width of the fastening belt 4.

In a preferred embodiment at least one, preferably all loops 3 on the outer face bear a so called male Velcro layer and the fastening belt 4 on the face overlapping the outer face of said loops 3 that is on the face faced towards the insulating layer 102 of the sleeve 1 bears a continuous strip of so called female Velcro. In order to make easier the closing of the fastening belt 4 and so in order to compress the sleeve 1 against the skin of the patient there is provided an additional portion of male Velcro on the outer face of the fastening belt 4 at the seam of the fastening belt 4 on the sleeve 1. It is possible to invert portions of Velcro that is to provide female Velcro on loops 3 and on the outer face of the fastening belt 4 and male Velcro on the inner face of the fastening belt 4.

In a further embodiment the fastening belt 4 is made of elastic material.

A method for manufacturing the removable electromagnetic shielding device 1 includes the following steps:
  cutting fabric layers 102, 101 composing the sleeve 1 made such to produce a multilayer fabric piece having a predetermined development and intended to form the shell part of the sleeve 1;
  printing seam lines on the outer side of the wall of the piece by serigraphy;
  printing signs for properly positioning device elements, such as snap fasteners 106 or ventilation apertures 8, by serigraphy;
  sewing fabric layers 101, 102 along the junction line of the shell of the sleeve 1, i.e., along piece edges oriented parallel with respect to the axial direction of the sleeve 1 in its finished condition;
  sewing the insulating layer 102 and the innermost electrically conductive layer 101 by perimetral and transverse seams 103;
  sewing on said layers further electrically conductive layers 101, particularly the second and the third electrically conductive layer 101 by perimetral seams 103;
  delimiting the tubular channel or coulisse 104 wherein the elastic element 105 is engaged by one or more seams along the longitudinal edge of the piece;
  bordering the piece by sewing a tape along the longitudinal edge along which the coulisse 104 is provided and along the perimetral edge of the opening of the sleeve 1 that is fastened against the part of the patient body k under examination;
  sewing loops 3 engaging the fastening belt 4 provided at the longitudinal edge, i.e., along the edge constituting the sleeve opening fastened against the part of the patient body K under examination;
  housing the fastening belt 4 in loops 3.

In a preferred embodiment, the manufacturing of the tubular channel or coulisse 104 wherein the elastic element 105 is engaged along a perimetral edge of the opening of the sleeve 1, occurs by overlapping a fabric layer on at least a further layer of the set of layers composing the sleeve 1 and by at least two seams connecting said layers along the longitudinal edge of the fabric piece and which seams are parallel and at a certain distance one with respect to the other such to delimit the channel on opposite sides.

It is further possible for the tubular channel or coulisse 104 to be made along a longitudinal edge of the fabric piece that is along the edge that will be the sleeve opening by overlapping the end band of a further fabric layer on the set of layers 101 and 102 and by subsequently fastening along seams or by folding on itself an end flap of the set of layers 101 and 102 composing the sleeve 1 and subsequent sewing.

Advantageously the fastening belt 4, provided at the edge composing the sleeve opening that is fastened against the part of the patient body K under examination, is sewn to the shell of the sleeve 1 at the junction line of the shell of the sleeve 1, i.e., along sewn edges of fabric layers 101, 102 oriented parallel with respect to the axial direction of the sleeve 1 in its finished condition.

The manufacturing method may further comprise the following steps:
  perforating the shell of the sleeve 1 for making ventilation apertures 8,
  positioning eyelets 802 at perforations by a fastening action, and
  positioning the electrically conductive fabric band 107 at the perimetral edge along which snap fasteners 106 are provided,
  perforating the shell of the sleeve 1 for positioning snap fasteners 106,
  positioning components of snap fasteners 106 by fastening action,
  sewing mechanical fastening band like Velcro or the like on loops 3 and on the outer and inner face of the fastening belt 4.

Particularly the removable device 1 having the shape of a sleeve with bellows walls is made of a fabric piece having a specific length and width preferably composed but not limited thereto of four fabric layers, three inner electrically conductive fabric layers 101 and an outer insulating fabric layer 102 made of polyamide overlapped one to the other.

Figure 9:
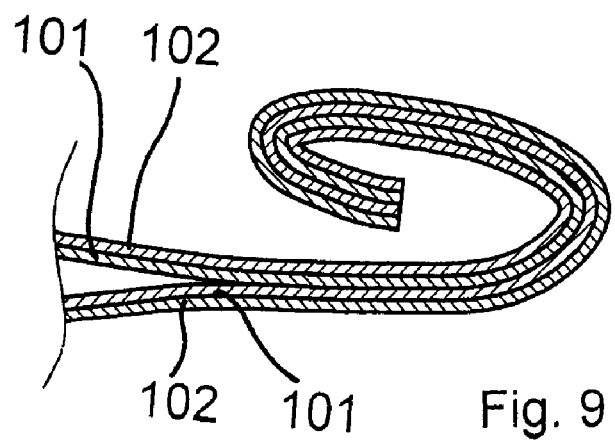
FIG. 9 is cross sectional view of the shell of the sleeve at the junction line of the two opposite end edges of the fabric piece.

As shown in FIG. 9, the seams of the sleeve 1 are made by connecting two opposite end edges of the fabric piece such to form a flexible tubular element and to generate a mechanical attachment and an electrical connection along said edges. In order to obtain a good electrical connection along joined edges the two end bands of the fabric piece are caused to be brought in an overlapped position along said edges to be joined in order to make a contact for all the surface of bands with the inner electrically conductive fabric layer 101 respectively. Subsequently the band is folded at least once, preferably two or more times, on itself and so said band folded for various times is attached by sewing it. The folding occurs always according to the same direction like winding the fabric of the end band about an axis parallel to said edge. Therefore the fabric of the band wound upon itself is flattened and locked by sewing it.

In all the embodiments illustrated and described in the present invention, electromagnetic noise is removed by connecting the shield to ground, thereby the electromagnetic pulses picked up by the body of the patient are eliminated.

Naturally, the invention is not limited to the embodiments described and illustrated hereinbefore, but it is limited by claims and equivalents thereof; the invention may be greatly varied, especially as regards construction. Further, for all means illustrated and described herein, there may be provided an alternative or combined use, in order to meet different needs, in different areas of the openings of the detection cavity. All this without departing from the inventive principle disclosed above and claimed below.

The invention claimed is:

1. An MRI apparatus comprising a removable electromagnetic shielding device, said MRI apparatus having a magnetic structure defining a detection cavity with at least one opening for introducing at least a part of a body under examination, said magnetic structure being for generating a static magnetic field, said cavity being surrounded by an electromagnetic shielding element having an opening coinciding with said at least one opening of the cavity, said electromagnetic shielding element being provided with a fastener for removably attaching and electrically connecting said electromagnetic shielding element to said removable electromagnetic shielding device, said fastener surrounding said opening of the cavity;

said electromagnetic shielding element being electrically connected to ground;

said removable electromagnetic shielding device being provided at said at least one opening of the cavity and being at least electrically connected to said electromagnetic shielding element at the opening of said shielding element;

said removable electromagnetic shielding device being a flexible tubular sleeve having a cylindrical and/or in a truncated cone shape, and having at least one passage opening for the body part;

said removable electromagnetic shielding device comprising means for fastening or compressing said at least one passage opening to the body part with a predetermined force against the body part in such a way as to close said at least one opening of the cavity and to generate a low-impedance electrical contact between the body part and said removable electromagnetic shielding device in order to prevent or reduce the infiltration of electromagnetic noise from outside to inside said cavity;

said removable electromagnetic shielding device being made of a first inner conductive material layer and an outer insulating fabric layer; and said removable eletromagnetic shielding device further comprising at least one additional inner electrically conductive material layer overlapping and electrically connected to the first inner electrically conductive material layer;

wherein said means for fastening or compressing comprise a fastening belt adapted to fasten an innermost conductive material layer of the removable electromagnetic shielding device against skin of the body part, thereby generating a large contacting surface between the body part and said innermost conductive material layer.

2. The MRI apparatus according to claim 1, wherein the electrically conductive material layers are made of fabric of metal and/or metallized wires.

3. The MRI apparatus according to claim 1, wherein the two or more electrically conductive material layers are in electrical and/or mechanical contact one with the other along mechanical connection lines extending at least along perimetral edges.

4. The MRI apparatus according to claim 3, wherein said mechanical/electrical connection lines are provided also at intermediate areas or they pass through intermediate areas between the perimetral edges of said shielding device.

5. The MRI apparatus according to claim 3, wherein the connection lines for the electrical contact and/or mechanical connection of the electrically conducting layers one with the other are uniformly arranged on the surface of the shielding device according to any arrangement patterns of mutual contact areas.

6. The MRI apparatus according to claim 1, wherein said fastening belt is adapted to fasten said innermost conductive material layer of the removable electromagnetic shielding device directly against skin of the body part.

7. The MRI apparatus according to claim 1, wherein the end of the removable electromagnetic shielding device associated with the body has a passage opening provided with a crown of spaced apart loops for engaging and/or sliding the fastening belt.

8. The MRI apparatus according to claim 7, wherein at least one of the loops has, on an outer face, one of two layers or components of a mechanical attaching tape of the hook and loop type.

9. The MRI apparatus according to claim 8, wherein the fastening belt has on the face overlapping the outer side of said loops the other component of the two components of the mechanical attaching tape.

10. The MRI apparatus according to claim 9, wherein the layer of the mechanical attaching tape extends for at least a part of the length and width of the fastening belt.

11. The MRI apparatus according to claim 10, wherein the layer of the mechanical attaching tape is positioned such that a progressive fastening of the fastening belt at loops against the body part inserted in the device is guaranteed.

12. The MRI apparatus according to claim 11, wherein the layer of the mechanical attaching tape extends in a continuous way for the length and width of the fastening belt.

13. The MRI apparatus according to claim 1, wherein the fastening belt is made of elastic material.

14. The MRI apparatus according to claim 13, wherein on the side attaching to the shielding element, opposite to the end associated with the body part, the shielding device has means for removably attaching and electrically connecting said device to said shielding element.

15. The MRI apparatus according to claim 14, wherein said removable attachment and electrical connection means are composed of a tubular channel or coulisse inside which a fastening element is engaged.

16. The MRI apparatus according to claim 15, wherein said fastening element is an O-ring type elastic ring for fastening about a flange, with an L-shaped section with respect to an axial plane, connected to the opening of the shielding element coinciding with the at least one opening of the detection cavity.

17. The MRI apparatus according to claim 15, wherein said tubular channel or coulisse is made by overlapping a fabric layer on at least a further layer of the set of layers composing the sleeve and by at least two seams connecting said layers along the longitudinal edge of the fabric piece and which seams are parallel and at a certain distance one with respect to the other such to delimit the channel on opposite sides.

18. The MRI apparatus according to claim 17, wherein said removable attaching and electrical connection means are composed of a crown of first and/or second parts of snap fasteners made of electrically conductive material, and are in electrical contact with at least one of the electrically conductive material layers while the shielding element at its opening is provided with a crown of respective first and second parts of snap fasteners made of electrically conductive material and electrically connected to said shielding element.

19. The MRI apparatus according to claim 18, wherein there is provided an electrically conductive fabric band, extending along an inner strip of the wall of the shielding device, by overlapping it, at perforations of the snap fasteners, in order to create a thickness at said perforations.

20. The MRI apparatus according to claim 1, wherein there are provided one or more ventilation apertures on a surface of said shielding device such to allow the air to circulate inside the shielding device.

21. The MRI apparatus according to claim 20, wherein said ventilation apertures are in electrical contact with at least one of the electrically conductive material layers.

22. The MRI apparatus according to claim 20, wherein an opening in said ventilation apertures is closed by a gauze or mesh and/delimited by eyelets.

23. A method for manufacturing an electromagnetic shielding device for an MRI apparatus having a magnetic structure defining a detection cavity with at least an opening for introducing at least a part of a body under examination, which cavity is surrounded by a shielding element having an opening coinciding with said at least one opening of the cavity, the electromagnetic shielding device comprising: a fastener for fastening the shielding device to the shielding element so as to surround said opening of the cavity and which shielding device is electrically connected to ground, wherein the fastener electrically connects the shielding device to the shielding element at the cavity opening; wherein the shielding device is flexible and is cylindrical and/or in a truncated cone shape, and has at least a passage opening for the body part; the shielding device is adapted to be fastened or compressed at said opening to the body part with a predetermined force in such a way as to close said opening and generate a low-impedance electrical contact between the body part and said shielding device to prevent or reduce the infiltration of electromagnetic noise from outside to inside said detection cavity; the shielding device is made of a first inner conductive material layer and an outer insulating fabric layer; and further comprises at least one additional electrically conductive material layer overlapping and electrically connected to the first inner electrically conductive material layer, the method comprising:

cutting fabric layers composing the shielding device to produce a multilayer fabric piece to form a shell part of the shielding device;

printing seam lines on an outer side of the fabric;

printing signs for properly positioning snap fasteners or ventilation apertures;

sewing the fabric layers along a junction line of a shell of the shielding device along piece edges oriented parallel with respect to the axial direction of the shielding device in its finished condition;

sewing the insulating layer and the innermost electrically conductive layer with perimetral and transverse seams;

sewing on said layers the additional conductive layers;

delimiting a tubular channel or coulisse wherein an elastic element is engaged by one or more seams along the longitudinal edge of the fabric, bordering the fabric piece by sewing a tape along the longitudinal edge along which the coulisse is provided and along the perimetral edge of the opening of the shielding device that is fastened against the part of the patient body under examination;

sewing loops engaging a fastening belt provided at the longitudinal edge;

housing the fastening belt in the loops.

24. The method for manufacturing a device according to claim 23, further comprising the following steps:

perforating the shell of the sleeve for making ventilation apertures, positioning eyelets at the perforations by a fastening action, positioning the electrically conductive fabric band at the perimetral edge along which snap fasteners are provided, perforating the shell of the shielding device for positioning the snap fasteners, positioning components of snap fasteners by fastening action, sewing a mechanical attaching band on the loops and on the outer and inner face of the fastening belt.

25. The method for manufacturing a device according to claim 24, wherein the sleeve shielding device is made by connecting two opposite end edges of the fabric piece by overlapping the two end bands of the fabric piece along said edges to be joined in order to make a contact for all the surface of bands with the inner electrically conductive fabric layer respectively subsequently folding said band at least once on itself and subsequently sewing it such that the folding occurs always according to the same direction like winding the fabric of the end band about an axis parallel to said edge and so a mechanical and electrical connection between said edges is produced.

* * * * *